United States Patent

Wardle

Patent Number: 6,046,595
Date of Patent: Apr. 4, 2000

[54] GROUP DELAY ESTIMATE SYSTEM USING LEAST SQUARE FIT TO PHASE RESPONSE RAMP

[75] Inventor: Jay M. Wardle, Seattle, Wash.

[73] Assignee: Hewlett-Packard Company, Palo Alto, Calif.

[21] Appl. No.: 08/348,625

[22] Filed: Dec. 2, 1994

Related U.S. Application Data

[62] Division of application No. 08/013,882, Feb. 5, 1993, Pat. No. 5,399,976.

[51] Int. Cl.[7] .................................................. G01R 25/00
[52] U.S. Cl. ............................ 324/615; 324/617; 702/67; 702/109
[58] Field of Search ..................................... 364/553, 554, 364/485; 324/617, 615, 76.82; 702/109, 67

[56] References Cited

U.S. PATENT DOCUMENTS

| | | | |
|---|---|---|---|
| 4,058,766 | 11/1977 | Vogel | 324/674 |
| 4,065,665 | 12/1977 | Rietsch | 364/487 |
| 4,658,367 | 4/1987 | Potter | 364/553 |
| 4,734,873 | 3/1988 | Malloy | 364/571.03 |

*Primary Examiner*—Ernest Karlsen
*Assistant Examiner*—Jose M. Solis

[57] ABSTRACT

The phase response of a network is measured at uniform frequency intervals. A linear regression analysis is performed on samples of the phase response measured at frequencies within an aperture centered on a group delay frequency to obtain an estimate of the group delay of the network at that frequency. The process is repeated for a sequence of group delay frequencies to determine a trace of the group delay of the network across a range of frequencies.

20 Claims, 4 Drawing Sheets

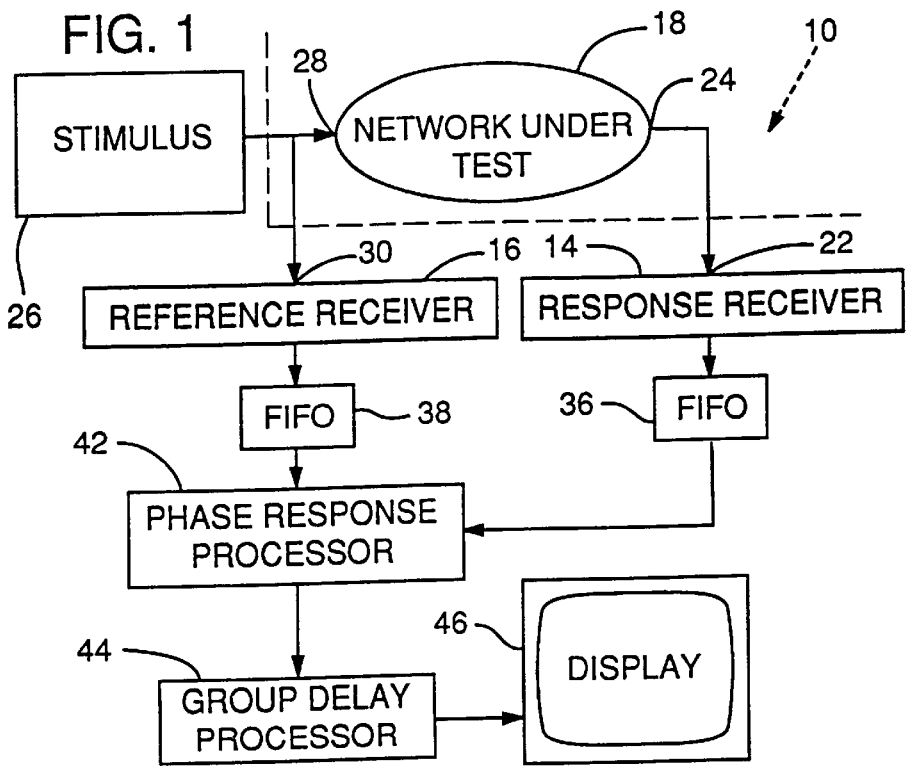
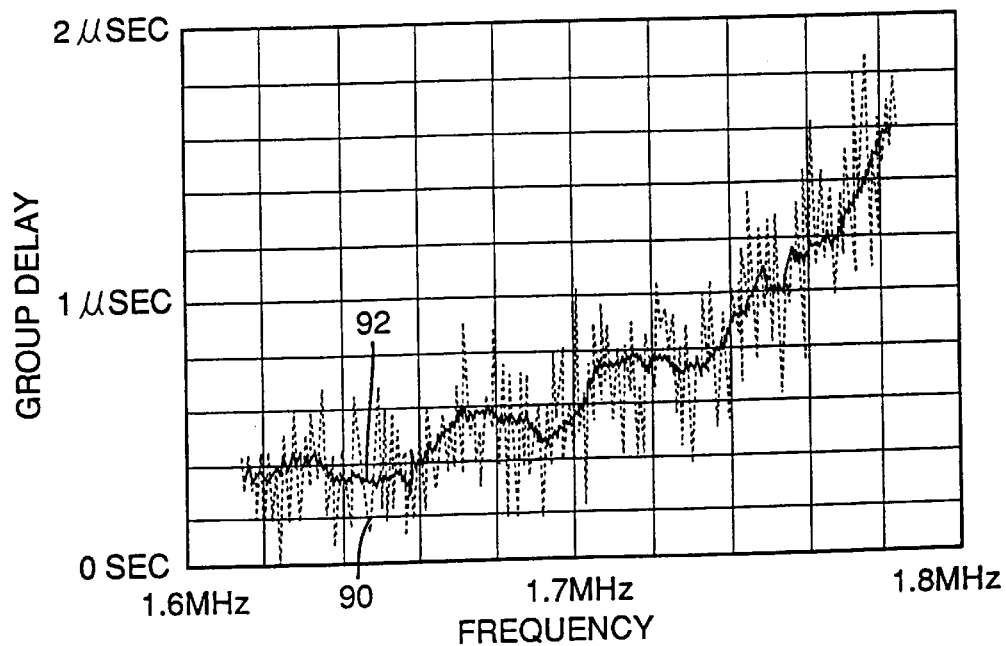

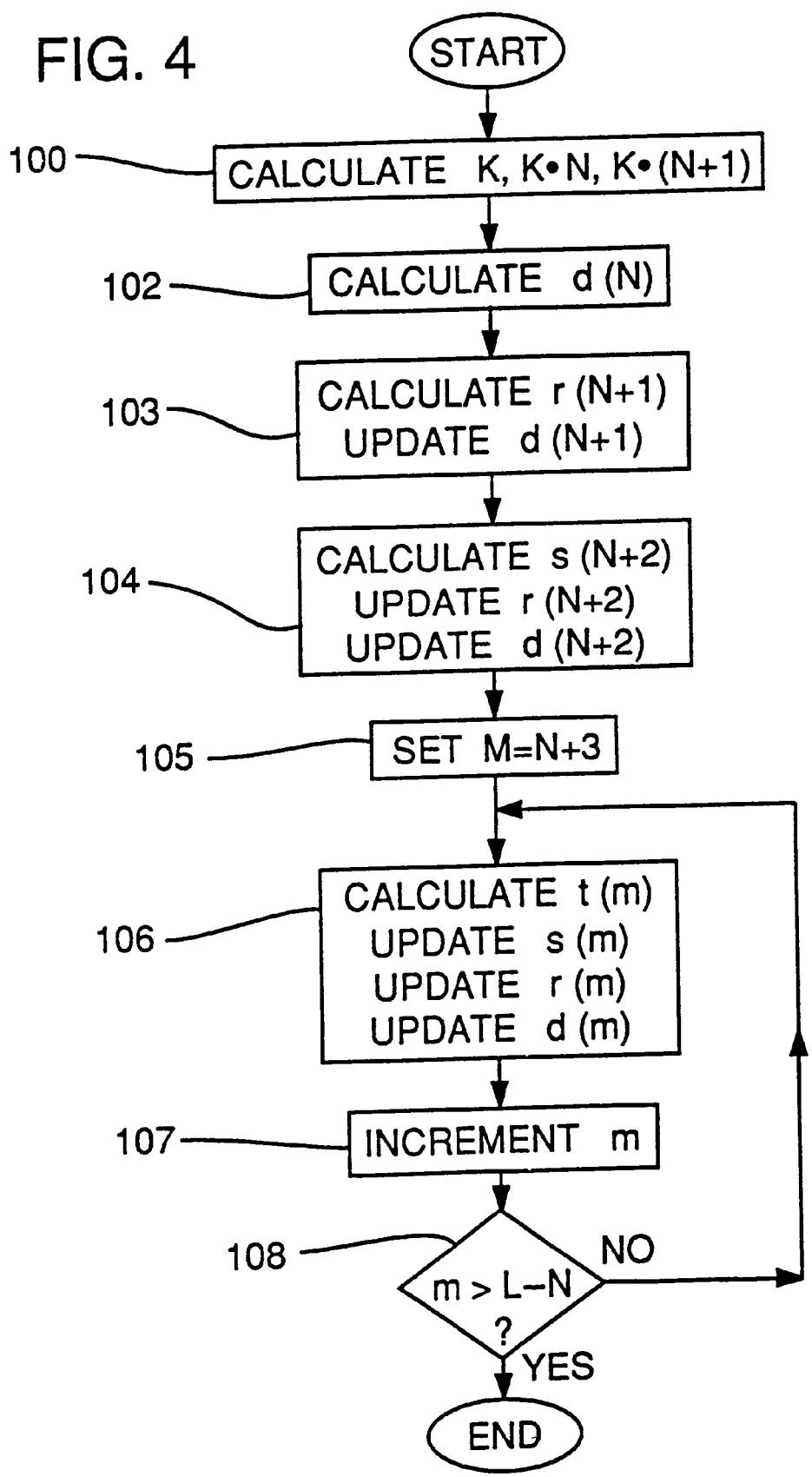

GROUP DELAY ESTIMATE SYSTEM USING LEAST SQUARE FIT TO PHASE RESPONSE RAMP this is a divisional of application Ser. No. 08/013,882 filed on Feb. 5, 1993, now U.S. Pat. No. 5,399,976.

FIELD OF THE INVENTION

The present invention relates to electronic measurement instruments, and more particularly to a method and apparatus for estimating the group delay of a network with such an instrument.

BACKGROUND AND SUMMARY OF THE INVENTION

For expository convenience, the present invention will be illustrated with reference to one particular application thereof, namely as a group delay estimator in a network analyzer. However, it should be recognized that the invention is not so limited.

In the field of the electrical arts, it is often necessary to analyze the electrical characteristics of a configuration of interconnected electrical components or "network." One characteristic of networks that is often of interest is the length of time required for a signal to travel from an input to an output. A measurement made on networks and related to this characteristic is known as the group delay. The group delay of a network is defined as the negative of the derivative of the phase response of the network with respect to frequency or, in other words, the rate at which the phase response changes with frequency.

Traditionally, the group delay of a network has been determined by measuring the phase response of the network at two different frequencies using a stimulus signal applied to an input of the network. The difference between the two frequencies is termed the "aperture." The group delay of the network at a frequency in the center of the aperture is calculated as the difference in unwrapped or cumulative phase between the two phase response measurements divided by the aperture width. Usually, the phase difference is measured in radians and the aperture width is measured in radians per second to yield a group delay measurement in seconds. However, other units can be used.

Previously, group delay measurements required special purpose, dedicated hardware. More recently however, electronic measurement instruments known as network analyzers have been used. Network analyzers can be used to provide a trace of the phase response of a network at discrete frequency intervals. The group delay of the network is determined from the traces using the traditional method. Two points on the network analyzer's trace corresponding to the phase response of the network at two given frequencies are subtracted, then divided by the difference between the given frequencies. The result is an approximation of the derivative of the network's phase response as a function of frequency. The negative of the result is therefore an estimate of the group delay. The method can be repeated at discrete intervals along the phase response trace to generate a group delay trace.

The traditional method of group delay estimation generates two types of error from the true group delay that are dependent on the aperture width. First, noise or random measurement errors in the phase response measurements cause corresponding errors in the group delay estimates. The effect of the noise errors on the group delay estimates can be decreased by increasing the aperture width. For example, if the aperture width is doubled and the noise variance of the phase response measurements is constant, the variance of the group delay estimates is halved.

Larger aperture widths, however, have a smoothing effect on the group delay trace, resulting in a group delay trace which is distorted from the actual group delay. In places where the actual group delay is changing rapidly, for example, the group delay trace produced with a large aperture width is smoother than the actual group delay. This distortion from the actual group delay is a second type of error. So, large aperture widths are desirable for minimizing noise variance in the group delay trace, while small aperture widths are desirable for minimizing distortion of the trace. The selection of aperture size becomes a tradeoff between conflicting desired noise minimization characteristics to preserve the true shape of the group delay trace.

The present invention provides a more accurate measurement of the group delay which has a decreased noise variance over a sequence of frequencies as compared to the traditional method. The present invention also provides a decreased trace distortion compared to the traditional method. In accordance with a preferred embodiment of the invention, the phase response of a network is measured at a sequence of stimulus signal frequencies. Using the unwrapped or cumulative phase response at a number of these frequencies within a frequency aperture, the phase response rate of change as a function of frequency is determined using linear regression techniques. Since the phase response rate of change as a function of frequency is the group delay, the result of the linear regression analysis yields a group delay estimate at a frequency in the center of the aperture. This group delay estimate determination is repeated at a sequence of frequencies to create a trace of the network's group delay across a range of frequencies.

The method of the present invention is also applicable to estimating traces of measurements other than group delay that are the derivative of a measurement trace. For example, the method can be applied to estimate a trace of the instantaneous frequency of a signal over time from a trace of the signal's phase measured at discrete sample times. In a prior frequency estimation system, described in U.S. Pat. No. 4,983,906 to Hiller, a single frequency estimate is calculated using linear regression analysis techniques. The frequency estimate calculated by the Hiller system assumes that the frequency of the signal remains constant over time. However, it is often useful to monitor signals where the instantaneous frequency changes over time such as phase or frequency modulated signals or signals with drifting frequencies. With the present invention, it is possible to form a trace estimate of the instantaneous frequency over time.

The foregoing and additional features and advantages of the invention will be more readily apparent from the following detailed description, which precedes with reference to the accompanying drawings.

DESCRIPTION OF THE DRAWINGS

FIG. 1 is a block diagram of a network analyzer employing a group delay estimator according to one embodiment of the present invention;

FIG. 4 is a flow chart of a computationally efficient process for estimating a group delay trace from phase response sample deltas according to a third embodiment of the invention;

FIG. 5 is a graphical comparison of a group delay trace performed according to the present invention to a group delay trace performed according to the traditional method, both using the same aperture width and phase response data.

DETAILED DESCRIPTION OF THE PREFERRED EMBODIMENT

Figure 2:
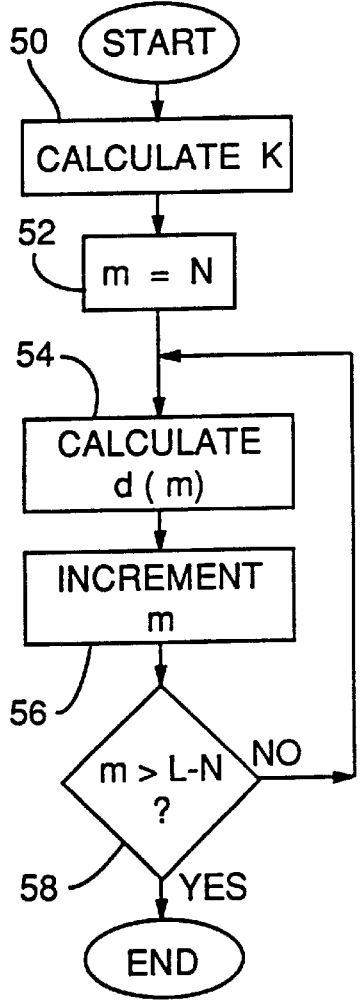
FIG. 2 is a flow chart of a process according to one embodiment of the present invention.

Referring to FIG. 1, a network analyzer 10 typically comprises two input receivers, a response receiver 14 and a reference receiver 16. When in use, the receivers 14, 16 are connected to a network 18 under test. An input 22 of the response receiver 14 is connected to an output 24 of the network 18 to receive an output signal of the network. A signal generator 26 produces a stimulus signal which drives an input 28 of the network 18 and an input 30 of the reference receiver 16. The signal generator 26 is preferably a component part of the network analyzer 10. However, an external signal generator can also be used as a source of the stimulus signal. Typically, the stimulus signal is a sine waveform having a frequency which is swept through a predetermined range of test frequencies (i.e., a frequency ramp signal). However, other forms of stimulus can be used such as noise, impulse or other arbitrary stimulus signals. The output signal is produced by the network 18 in response to the stimulus signal.

Connected to the receivers 14, 16 are first-in, first-out (FIFO) memory queues 36, 38. The receivers 14, 16 digitally sample the output and stimulus signals, producing streams of digital samples of the signals which are placed in the memory queues 36, 38.

The signal samples are read out of the memory queues 36, 38 in FIFO order by a phase response processor 42. The phase response processor 42 processes the digital samples of the stimulus and output signals in a well-known manner to produce phase response samples at uniform frequency intervals. The uniform frequency spaced, phase response samples are known as "bins." These phase response samples correspond to the unwrapped phase response of the network at various bins across a selected range of frequencies. The phase response samples are "unwrapped" in the sense that the phase is not limited to the range 0 to $2\pi$. Rather, the phase response samples correspond to the cumulative phase response of the network.

The phase response samples are organized by the phase response processor 42 into an array, P[i], according to ascending order of stimulus signal frequency. The array P[i] has indices i between zero and a maximum index number L. Each index i of the array corresponds to a uniformly spaced frequency. The phase response sample or bin stored in the array at each index corresponds to the phase response of the network at the respective frequency.

The phase response samples are processed by the group delay processor 44 to determine the group delay of the network 18 at a number of frequencies. In general, the group delay processor 44 applies linear regression analysis to determine a phase ramp having a least mean square error fit to a set of the phase response samples. The set of phase response samples used to determine the phase ramp on a selected frequency are those phase response samples within a frequency aperture centered on the selected frequency. The negative of the slope of this phase ramp corresponds to the group delay of the network at the selected frequency. The analysis is repeated to produce additional group delay estimates at a sequence of other frequencies. The group delay estimates determined by the group delay processor 44 are indicated visually on a display 46. In some embodiments of the invention, the group delay estimates may also be stored in a data file or transferred to other computing devices for other end uses.

More specifically, the group delay processor 44 applies the process shown in FIG. 2. In the first step 50, the group delay processor calculates a scale factor K used in the linear regression analysis formula described below.

In step 52, the phase response processor sets a loop variable m equal to an initial value of N where 2N+1 is the number of phase response samples within an aperture centered on the bin indexed by the loop variable m. (The aperture therefore includes N bins to each side of the bin indexed by the loop variable m.) The remaining steps 54, 56, 58 form a loop which is repeated once for each value of the variable m between N and L−N. At step 54 in the loop, the group delay processor determines an estimate of the group delay d(m) at the frequency of the bin indexed by the loop variable m. The loop variable m is incremented each iteration of the loop at step 56. Step 58 compares the loop variable m to the number L−N and repeats the loop until the loop variable exceeds L−N. Thus, the group delay processor will determine estimates of the group delay d(m) for the indices i=N to i=L−N. Calculating d(m) for only those indices between N and L−N ensures that there are an adequate number of phase response samples to each side of the bin indexed by the loop variable m to complete the frequency aperture.

In step 54, the group delay d(m) is calculated according to the following formula which is a standard linear regression analysis formula in the form of the moving average adapted to the variables of phase response and frequency:

$$d(m) = K \sum_{i=-N}^{i=N} (i \cdot P[m+i]) \quad (1)$$

where K (the scale factor)=$3/(N*(N+1)*(2*N+1))$.

The function d(m) in equation (1) provides the slope of a phase ramp which is a least mean square error fit to the phase response samples within the aperture. However, the group delay of a network is defined as the negative of the derivative of the phase response with respect to frequency. Therefore, the value given by the function d(m) in equation (1) is actually the negative of an estimate of the network's group delay. To properly estimate the group delay, the function d(m) must be scaled by a negative one. Preferably, this is accomplished by multiplying the scale factor K by a negative one so that K=$-3/(N*(N+1)*(2*N+1))$. The scale factor K may also be scaled by other factors to convert the estimate to desired units of measure. Without further scaling, the function d(m) gives the group delay in radians or degrees per bin depending on the units of the phase response samples. Thus, the scale factor K must be divided by the frequency spacing per bin in Hertz to determine group delay estimates in radians or degrees per Hertz. The scaling factor K may be scaled by other factors to obtain group delay estimates in other units.

The process described above is fairly computationally intensive, averaging 2N addition operations and 2N+2 multiply operations per group delay estimate. In other words, each group delay estimate involves an "order of N" calculation, a computational load that varies dependent on the aperture width. Fortunately, regularities in the formula of equation (1) can be exploited to lower the total number of math operations required by the process where more than one group delay estimate as made. For example, a function f(m) equal to the difference between d(m) and d(m−1) can be defined as follows:

$$f(m) = K \cdot \left( N \cdot (P[m+N] \cdot P[m-N-1]) - \sum_{j=m-N}^{j=m+N-1} (P[j]) \right) \quad (2)$$

The function f(m) is a group delay delta between adjacent bins.

A second function g(m) equal to the difference between f(m) and f(m−1) can then be derived as follows:

$$g(m) = (K \cdot N)(P[m+N] - P[m-N-2]) + (K(N+1))(P[m-1-N] - P[m-1+N]) \quad (3)$$

The group delay delta f(m) can also be expressed in terms of the function g(m) as follows:

$$f(m) = f(m-1) + g(m) \quad (4)$$

Further, the group delay estimate d(m) can be expressed in terms of the group delay delta as follows:

$$d(m) = d(m-1) + f(m) \quad (5)$$

The functions f(m) and g(m) can be used to implement a more computationally efficient process for estimating a plurality of group delays at a sequence of frequencies. Using these equations, the group delay estimates can be made by a pair of accumulators. A first or group delay accumulator stores the current group delay estimate d(m). A second or group delay delta accumulator stores the group delay delta f(m). After determining the initial group delay estimate and group delay delta, subsequent group delay estimates can be determined by, first, calculating the difference function g(m) between the current and next group delay deltas according to equation (3). Then, updating the group delay delta in the second accumulator by adding the calculated value of g(m) for the next frequency. Finally, the group delay estimate is updated in the first accumulator by adding the group delay delta from the second accumulator. In this manner, only five addition or subtraction operations and two multiplication operations are required to determine each subsequent group delay estimate. With a fixed number of operations per subsequent group delay estimate, each subsequent estimate is an order of one calculation and invariant of changes in the aperture width. Thus, for large aperture widths, the computationally efficient method offers significant performance improvement.

Figure 3:
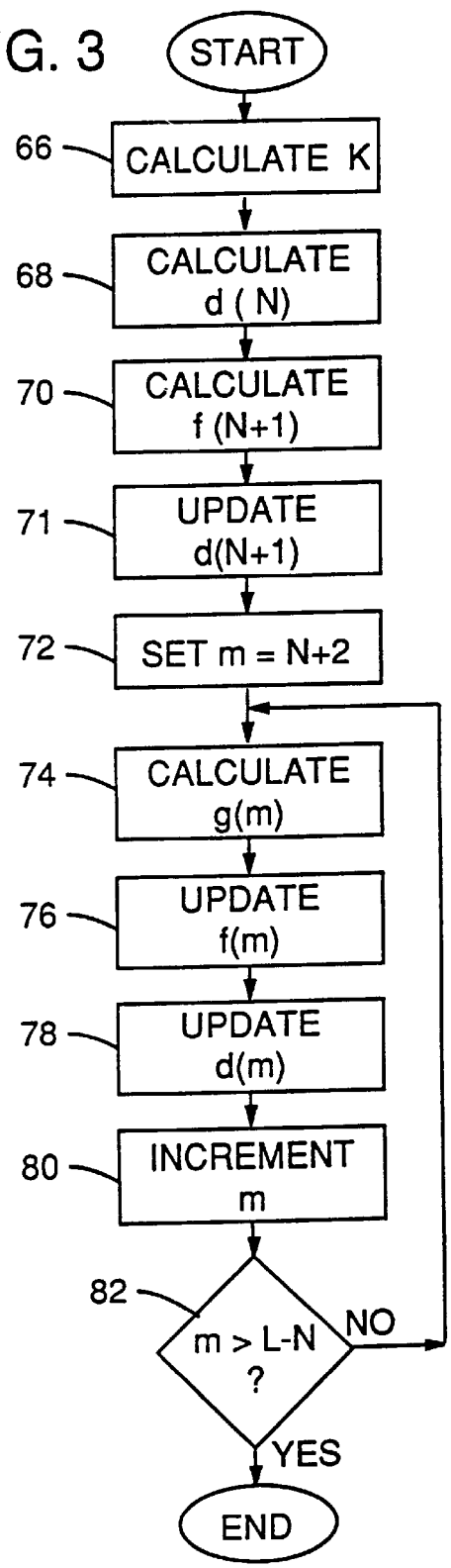
FIG. 3 is a flow chart of a computationally efficient process according to a second embodiment of the invention.

FIG. 3 illustrates in more detail this computationally efficient form of the process employing the f(m) and g(m) functions. The initial portion of the process comprises steps 66–72. The initial step 66 in the process is to calculate the scale factor K used by the functions d(m), f(m), and g(m). Preferably, the values of K*N and K(N+1) are also calculated since they are constants used by the function g(m) for each group delay estimate. In the second step 68, the group delay processor determines the group delay estimate for the frequency index N according to equation (1), i.e. d(N) is determined. This determines the initial value of the group delay accumulator. In step 70, the value of f(N+1) is determined according to equation (2). The value f(N+1) is the initial value for the group delay delta accumulator. Using the values for d(N) and f(N+1) determined in steps 68, 70, the group delay estimate for the frequency index N+1 (i.e., d(N+1)) is determined in step 71 using equation (5). In the last step 72 of the initial portion of the process, a loop variable m is set equal to N+2.

Next, the process has a loop portion comprising calculation steps 74–80 and comparison step 82. In the first step 74 of the loop portion, the value of the function g(m) is calculated according to the equation (3) for the loop variable m. This value is used in step 76 to update the group delay delta accumulator. In step 76, the next group delay delta is calculated according to equation (4). The value g(m) from step 74 is added to the value in the group delay delta accumulator to update the accumulator to f(m). This accumulator value will be used in step 78 to update the group delay accumulator.

In step 78, the next group delay estimate is calculated according to equation (5). In accordance with equation (5), the group delay delta f(m) for the frequency index m (the value in the group delay delta accumulator from step 76) is added to the value in the group delay accumulator to produce the next group delay estimate d(m). This updates the group delay accumulator to the group delay for the frequency index m.

In step 80, the loop variable m is incremented. Then in step 82, the loop variable is compared to the value L−N to determine if the process is complete. If the loop variable m is greater than L−N, the process is complete. Otherwise, the loop portion of the process is repeated using the incremented loop variable m.

As each group delay estimate is calculated in step 78, it is stored in a group delay trace preferably in the form of an array. Thus, the process requires that data storage for both an array of the phase response samples P[i] and an array of values of the function d(m) for m=N to m=L−N are maintained. However, the only values of the functions f(m) and g(m) that need be maintained are those for the current calculation of d(m) within the loop portion (steps 74–82) of the process. By comparison, in the process shown in FIG. 2, two arrays for storing the phase response trace and the group delay trace are also maintained. The computationally intensive process shown in FIG. 3, therefore, requires minimal additional data storage.

A further modification to the above processes can be made to avoid problems of numerical representation. In the processes described above, the unwrapped phase response is used. If the phase response of a network varies over many cycles in the tested frequency range, a large number of digits will be required to represent the untrapped phase response with sufficient precision. For example, if four hundred phase response samples are obtained and the difference in phase response between adjacent samples is nearly 180 degrees (the maximum difference in phase response between adjacent samples that can be detected unambiguously), then nearly 200 cycles of phase response will have been accumulated between the first and last phase response samples. About 9 bits of mantissa are required to represent this amount of unwrapped phase response with sufficient precision.

To avoid numerical representation problems caused by the use of the unwrapped phase response, the processes described above can be modified so that the phase response samples are represented in terms of the difference in phase response from a previous adjacent sample (phase response delta) instead of the unwrapped phase response. The linear regression formula of equation (1) must be modified to account for this change. With the phase response delta samples organized into an array D[i] such that, for i=1 to i=L:

$$D[i]=P[i]-P[i-1] \qquad (6)$$

the formula is as follows:

$$d(m) = \frac{K}{2} \cdot \sum_{i=1-N}^{i=N} ((N=i) \cdot (N+1-i) \cdot D[m+i]) \qquad (7)$$

The equation (7) can be used to compute each group delay estimate directly in a process identical to that shown in FIG. 2. A computationally efficient process similar to the process shown in FIG. 3 can also be derived from the equation (7). However, one additional accumulator step is required. A group delay delta function r(m) equal to the difference between d(m) and d(m−1) is derived as follows:

$$r(m) = K \cdot \left( \sum_{i=-N}^{i=N} (i \cdot D(m+i)) \right) \qquad (8)$$

A function s(m) equal to the difference between r(m) and r(m−1) is derived as follows:

$$s(m) = K \left( N \cdot (D(m=N) + D(m-1-N)) - \sum_{i=-N}^{i=N-1} (D(m+i)) \right) \qquad (9)$$

A function t(m) equal to the difference between s(m) and s(m−1) is derived as follows:

$$t(m)=K \cdot N(D(m+N) -D(m-N-2))+K(N+1) (D(m-1-N)-D(m-1+N)) \qquad (10)$$

The function s(m) can then be expressed in terms of the function t(m) as follows:

$$s(m)=s(m-1)+t(m) \qquad (11)$$

The function r(m) expressed in terms of the function s(m) is:

$$r(m)=r(m-1)+s(m) \qquad (12)$$

Finally, the function d(m) expressed in terms of the function r(m) is:

$$d(m)=d(m-1)+r(m) \qquad (13)$$

With reference to FIG. 4, the functions r(m), s(m), and t(m) are used in a computationally efficient process for estimating the group delay trace from the phase response delta which is similar to the computationally efficient process shown in FIG. 3. In the process shown in FIG. 4, however, an additional accumulator is required, i.e. the functions d(m), r(m), and s(m) all operate as accumulators updated in turn according to the equations (11)–(13). More specifically, in an initial step 100, the values of the constants K, K*N, and K(N+1) are calculated. In step 102, the value of d(N) is determined according to equation 7. In step 103, the value of r(N+1) is determined according to equation (8) then d(N+1) is determined from r(N+1) using equation (13). In step 104, the value of s(N+2) is determined according to equation (9) then r(N+2) and d(N+2) are determined from s(N+2) using equations (12) and (13), respectively. The values of d(m) for m=N+3 to m=L−N are determined within a loop comprising steps 105–108. In step 106 in the loop, the value of t(m) is determined according to equation (10) then the values of s(m), r(m), and d(m) are determined in order according to equations (11)–(13), respectively.

FIG. 5 shows an example of the results obtainable through use of the present invention. A first trace 90 is a measurement of the group delay of a network over a range of frequencies between 1.6 and 1.8 MHz using the traditional method of the prior art. A second trace 92 is a measurement of the group delay of the same network over the same frequency range applying the present invention. An aperture containing 64 phase response samples was used for each group delay estimate in the traces 90, 92. The trace 90 using the traditional method has a significantly greater variance than the trace 92 using the present invention. Theoretically, for a large number n of samples in the aperture, the decrease in variance provided by the present invention should be approximately n/6. In this example where there are 64 samples in the aperture, the variance of trace 92 should be about 11 times less than the variance of trace 90.

Figure 6:
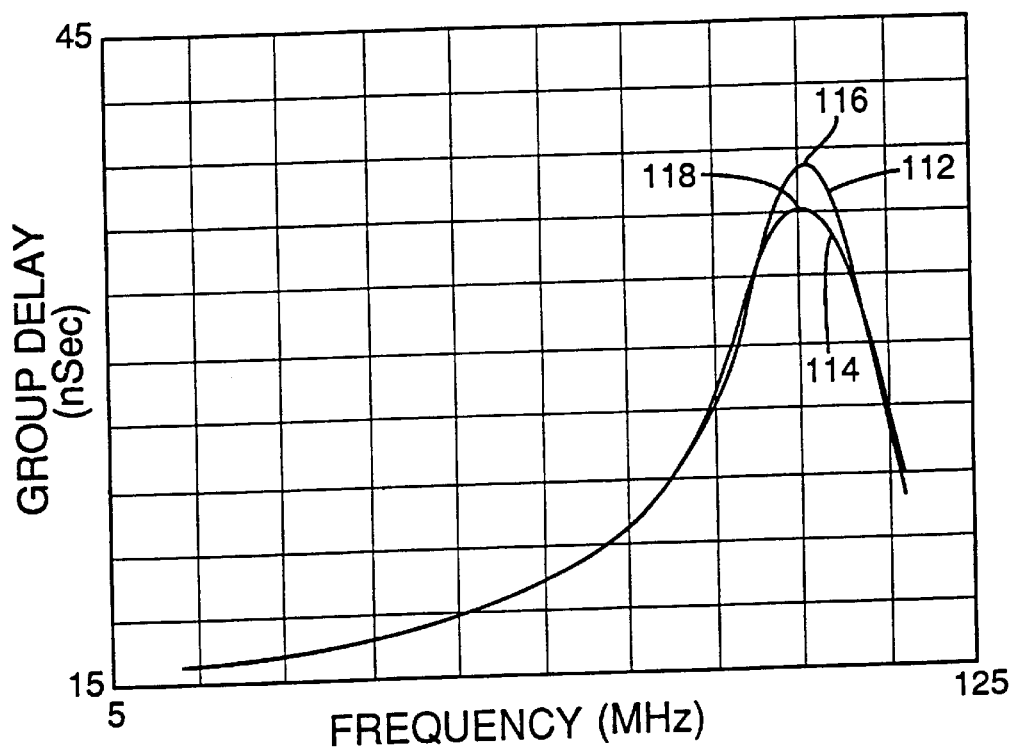
FIG. 6 is a graphical comparison of a group delay trace performed according to the present invention to a group delay trace performed conventionally on the same network.

In FIG. 6, a group delay trace 112 of a network over a range of frequencies from 5 MHz to 125 MHz performed according to the present invention is compared to a group delay trace 114 of the same network performed using the traditional method of the prior art. The group delay trace 112 of the present invention has a peak group delay 116 higher than a peak group delay 118 of the trace 114. The lower peak group delay 118 is due to the smoothing effect of the traditional method. The present invention produces less distortion than the traditional method, resulting in the group delay trace 112 that is closer to the actual group delay of the network.

The method of the present invention is also applicable to estimating traces of measurements other than group delay that are the derivative of a measurement trace. For example, the method can be applied to estimate a trace of the instantaneous frequency of a signal over time from a trace of the signal's phase measured at discrete sample times. Either the form of the method illustrated in FIG. 2 or the form illustrated in FIG. 3 can be used. The only required modification to the methods is to rescale the constant multipliers in the equations so that frequency, which is the rate of change of phase versus time, is calculated. Further, if the phase trace is in the form of phase delta samples (i.e., each sample in the trace is the difference in phase from the previous sample time), the methods for performing an estimate from a delta trace such as the method illustrated in FIG. 4 can be used. Again, the constant multipliers in the equations must be rescaled.

Having described and illustrated the principles of my invention with reference to a preferred embodiment thereof, it will be apparent that the invention can be modified in arrangement and detail without departing from such principles. For example, although illustrated in FIG. 1 with separate phase response and group delay processors, the invention can also be implemented with a single processor suitable for executing the processes carried out by both of the separate processors.

Further, although illustrated with the invention embodied in a network analyzer, the invention can also be employed in other applications not involving a network analyzer to determine the group delay of a network when provided with measurements of the phase response of the network.

The form of the methods can also be modified without departing from the principles of the invent,on. Among other modifications in the method illustrated in FIG. 3, steps 74 and 76 of calculating g(m) and f(m) need not be performed separately. The calculation of g(m) can be done implicitly in a direct update of f(m).

Accordingly, I claim as my invention all such modifications as may come within the scope and spirit of the following claims and equivalents thereto:

I claim:

1. In an electronic measurement instrument, a method for estimating a trace of second measurements related to the derivative of a trace of first measurements of an electrical property of a network, the method comprising:

obtaining a plurality of uniformly spaced samples of a first measurement to form the first trace; and performing a least mean squares fit to samples in the first trace within each of a plurality of apertures to determine a plurality of estimates of a second measurement for forming the second trace.

2. The method of claim 1 further comprising multiplying the second trace by a constant multiplier to form a trace of estimates of the second measurement.

3. The method of claim 2 wherein the first measurements are the phase response of a network sampled at uniformly spaced frequencies and the second measurements are the group delay of the network at various frequencies.

4. The method of claim 1 wherein the first measurements are the phase of a signal sampled at uniformly spaced sample times and the second measurements are the instantaneous frequency of the signal at various times.

5. The method of claim 1 comprising:

determining a first estimate in the second trace by performing a least mean square error fit to samples of the first trace within a first aperture;

determining each subsequent estimate in the second trace by determining a value which, when added to a previous estimate adjacent the subsequent estimate, provides a least mean square error fit to samples of the first trace within a subsequent aperture of the plurality of apertures, and adding the value to the previous estimate to form the subsequent estimate.

6. An electronic measurement instrument comprising:

a reference receiver connectable to an input of a network to receive a stimulus signal;

a response receiver connectable to an output of the network to receive a network output signal produced by the network in response to the stimulus signal;

means for measuring the phase response of the network at uniform intervals of frequency; and means for performing a least mean squared error analysis on a number of phase response measurements made at frequencies within each of a plurality of apertures to estimate a group delay trace of the network at a plurality of selected frequencies.

7. The instrument of claim 6 wherein the means for measuring the phase response of the network is a phase response processor for determining an array of phase response data measured at uniform frequency intervals from samples of the stimulus signal and the network output signal.

8. The instrument of claim 7 wherein the means for performing the least mean square error analysis is a group delay processor for performing the least mean squared error analysis on subsets of the array to yield estimates of the group delay of the network at a plurality of selected frequencies.

9. The instrument of claim 6 wherein the means for measuring the phase response and the means for performing the least mean square error analysis are embodied in a single processor.

10. The instrument of claim 6 wherein the phase response measurements are measurements of the cumulative phase response of the network.

11. The instrument of claim 6 wherein the phase response measurements are measurements of the difference in phase response of the network between two adjacent frequencies.

12. The method of claim 3 comprising:

determining a first estimate in the second trace by performing a least mean square error fit to samples of the first trace within a first aperture;

determining each subsequent estimate in the second trace by determining a value which, when added to a previous estimate adjacent the subsequent estimate, provides a least mean square error fit to samples of the first trace within a subsequent aperture of the plurality of apertures, and adding the value to the previous estimate to form the subsequent estimate.

13. The method of claim 3 further comprising multiplying the second trace by a constant multiplier to form a trace of estimates of the second measurement.

14. The method of claim 4 comprising:

determining a first estimate in the second trace by performing a least mean square error fit to samples of the first trace within a first aperture;

determining each subsequent estimate in the second trace by determining a value which, when added to a previous estimate adjacent the subsequent estimate, provides a least mean square error fit to samples of the first trace within a subsequent aperture of the plurality of apertures, and adding the value to the previous estimate to form the subsequent estimate.

15. The method of claim 4 further comprising multiplying the second trace by a constant multiplier to form a trace of estimates of the second measurement.

16. In an electronic measurement instrument, a method for estimating a trace of second measurements related to the derivative of a trace of first measurements of an electrical property of a network, the method comprising:

obtaining a plurality of uniformly spaced samples of a first measurement to form the first trace; and performing a least mean squares fit of a linear function to samples in the first trace within each of a plurality of apertures, wherein at least two of the apertures have more than one of the samples in common; and determining a plurality of estimates of a second measurement centered in the apertures to form the second trace.

17. The method of claim 16 further comprising multiplying the second trace by a constant multiplier to form a trace of estimates of the second measurement.

18. The method of claim 16 wherein the first measurements are the phase response of a network sampled at uniformly spaced frequencies and the second measurements are the group delay of the network at various frequencies.

19. The method of claim 16 wherein the first measurements are the phase of a signal sampled at uniformly spaced times and the second measurements are the instantaneous frequency of the signal at various times.

20. The method of claim 16 comprising:

determining a first estimate in the second trace by performing a least mean square error fit to samples of the first trace within a first aperture;

determining each subsequent estimate in the second trace by determining a value which, when added to a previous estimate adjacent the subsequent estimate, provides a least mean square error fit to samples of the first trace within a subsequent aperture of the plurality of apertures, and adding the value to the previous estimate to form the subsequent estimate.

* * * * *